United States Patent
Samarao et al.

(10) Patent No.: US 10,224,540 B2
(45) Date of Patent: Mar. 5, 2019

(54) LI-ION BATTERY WITH ALUMINA COATED POROUS SILICON ANODE

(71) Applicants: Ashwin K. Samarao, Mountain View, CA (US); Gary O'Brien, Palo Alto, CA (US); Ando Feyh, Palo Alto, CA (US); Robert Bosch GmbH, Stuttgart (DE)

(72) Inventors: Ashwin K. Samarao, Mountain View, CA (US); Gary O'Brien, Palo Alto, CA (US); Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 257 days.

(21) Appl. No.: 14/910,695

(22) PCT Filed: Aug. 8, 2014

(86) PCT No.: PCT/US2014/050321
§ 371 (c)(1),
(2) Date: Feb. 6, 2016

(87) PCT Pub. No.: WO2015/021368
PCT Pub. Date: Feb. 12, 2015

(65) Prior Publication Data
US 2016/0190564 A1 Jun. 30, 2016

Related U.S. Application Data

(60) Provisional application No. 61/864,012, filed on Aug. 9, 2013.

(51) Int. Cl.
*H01M 4/36* (2006.01)
*H01M 10/0525* (2010.01)
(Continued)

(52) U.S. Cl.
CPC ........... *H01M 4/366* (2013.01); *C23C 16/045* (2013.01); *C23C 16/403* (2013.01);
(Continued)

(58) Field of Classification Search
CPC .... H01M 4/366; H01M 4/134; H01M 10/058; H01M 4/0428; H01M 4/386;
(Continued)

(56) References Cited

U.S. PATENT DOCUMENTS

| 5,059,497 A | 10/1991 | Prince et al. |
| 2005/0244322 A1* | 11/2005 | Chen ............... C01B 33/113 423/335 |

(Continued)

FOREIGN PATENT DOCUMENTS

KR  10-2007-0034038  3/2007

OTHER PUBLICATIONS

Nguyen et al.; Alumina-coated silicon-based nanowire arrays for high quality Li-ion battery anodes; Journal of aterials Chemistry; Sep. 25, 2012; 9 pages; The Royal Society of Chemistry, www.rsc.org/materials.

(Continued)

*Primary Examiner* — Lisa S Park
(74) *Attorney, Agent, or Firm* — Maginot Moore & Beck LLP (57) ABSTRACT

A Li-ion battery in one embodiment includes a lithium based compound in a cathode, a first porous silicon portion in an anode, and a layer of atomic layer deposited (ALD) alumina coating the first porous silicon portion and contacting the cathode.

9 Claims, 8 Drawing Sheets

(51) Int. Cl.

| | |
|---|---|
| *H01M 10/0562* | (2010.01) |
| *C23C 16/40* | (2006.01) |
| *C23C 16/455* | (2006.01) |
| *C23C 16/52* | (2006.01) |
| *H01M 4/04* | (2006.01) |
| *H01M 4/38* | (2006.01) |
| *H01M 4/134* | (2010.01) |
| *H01M 10/058* | (2010.01) |
| *C23C 16/04* | (2006.01) |
| *H01M 4/02* | (2006.01) |

(52) U.S. Cl.
CPC ........ *C23C 16/45555* (2013.01); *C23C 16/52* (2013.01); *H01M 4/0428* (2013.01); *H01M 4/134* (2013.01); *H01M 4/382* (2013.01); *H01M 4/386* (2013.01); *H01M 10/058* (2013.01); *H01M 10/0525* (2013.01); *H01M 10/0562* (2013.01); *H01M 2004/021* (2013.01); *H01M 2220/20* (2013.01); *H01M 2220/30* (2013.01); *H01M 2300/0071* (2013.01); *H01M 2300/0094* (2013.01); *Y02E 60/122* (2013.01); *Y02T 10/7011* (2013.01)

(58) Field of Classification Search
CPC ............. H01M 4/382; H01M 10/0525; H01M 10/0562; H01M 2004/021; H01M 2220/30; H01M 2220/20; H01M 10/7011; H01M 2300/0071; H01M 2300/0094; C23C 16/045; C23C 16/403; C23C 16/45555; C23C 16/52; Y02E 60/122; Y02T 10/7011
See application file for complete search history.

(56) References Cited

U.S. PATENT DOCUMENTS

| | | | | |
|---|---|---|---|---|
| 2009/0142474 | A1* | 6/2009 | Gandikota | C23C 16/0281 427/58 |
| 2011/0311882 | A1 | 12/2011 | Kim et al. | |
| 2012/0077082 | A1 | 3/2012 | Se-Hee et al. | |
| 2013/0078508 | A1* | 3/2013 | Tolbert | H01M 4/134 429/188 |
| 2013/0078513 | A1 | 3/2013 | Nathan | |
| 2013/0115507 | A1 | 5/2013 | Wang | |
| 2013/0224632 | A1* | 8/2013 | Roumi | H01M 2/166 429/516 |
| 2013/0337309 | A1* | 12/2013 | Virkar | H01M 10/3927 429/104 |
| 2014/0272564 | A1* | 9/2014 | Holme | H01M 4/364 429/211 |

OTHER PUBLICATIONS

Supplementary European Search Report corresponding to European Patent Application No. 14 83 4944 (10 pages).
He, Yu et al., "Alumina-Coated Patterned Amorphous Silicon as the Anode for a Lithium-Ion Battery with High Coulombic Efficiency", Advanced Materials, vol. 23, No. 42, 26 Sep. 2011, pp. 4938-4941 (4 pages).
Xiao, Xingcheng et al, "Ultrathin Multifunctional Oxide Coatings for Lithium Ion Batteries", Advanced Materials, vol. 23, No. 34, Jul. 22, 2011, pp. 3911-3915 (5 pages).
European Examination Report corresponding to European Patent Application No. 14 834 944.2 (8 pages).
Webber, J. B. W. et al., "An evaluation of NMR cryoporometry, density measurement and neutron scattering methods of pore characterisation," Magnetic Resonance Imaging, vol. 19, No. 3-4, pp. 395-399, Elsevier Science, 2001.
Sailor, Michael J., "Fundamentals of Porous Silicon Preparation," Porous Silicon in Practice: Preparation, Characterization and Applications, Wiley, 2012.
International Search Report corresponding to PCT Application No. PCT/US2014/050321, dated Nov. 21, 2014 (3 pages).
Szczech et al.; Nanostructured Silicon for High Capacity Lithium Battery Anodes; Energy & Environmental Science; Nov. 16, 2010; pp. 56-72; vol. 4; The Royal Society of Chemistry 2011, www.rsc.org/ees.
Thakur et al.; Inexpensive method for producing macroporous silicon particulates (MPSPs) with pyrolyzed polyacrylonitrile for lithium ion batteries;Scientific Reports; Nov. 8, 2012; 7 Pages; www.nature.com/scientificreports.

* cited by examiner

LI-ION BATTERY WITH ALUMINA COATED POROUS SILICON ANODE

This application is a 35 U.S.C. § 371 National Stage Application of PCT/US2014/050321, filed on Aug. 8, 2014, which claims the benefit of priority to U.S. Provisional Application No. 61/864,012, filed on Aug. 9, 2013 and entitled "Li-Ion Battery with Alumina Coated Porous Silicon Anode," the disclosures of which are incorporated herein by reference in their entirety.

FIELD OF THE DISCLOSURE

This disclosure relates to batteries and more particularly to lithium-ion batteries.

BACKGROUND

Figure 1:
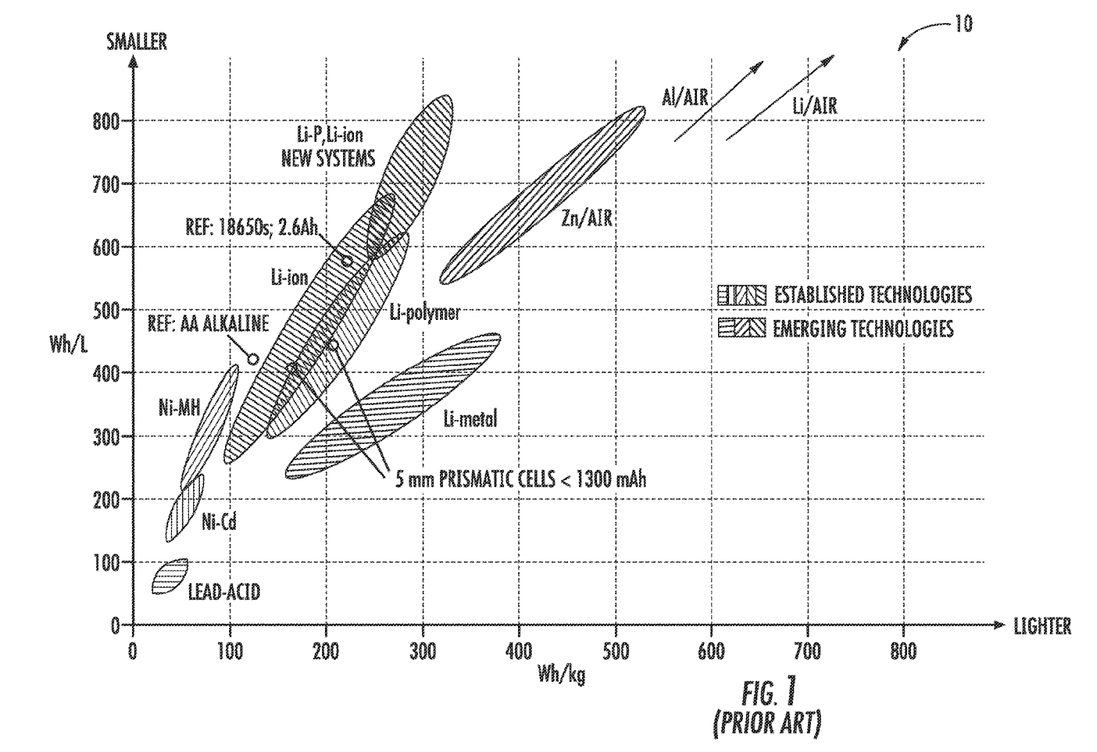
FIG. 1 depicts a chart of the specific energy and energy density for a number of different battery chemistries.

Batteries are a useful source of stored energy that can be incorporated into a number of systems. Rechargeable lithium-ion batteries are attractive energy storage systems for portable electronics and electric and hybrid-electric vehicles because of their high specific energy compared to other electrochemical energy storage devices. In particular, FIG. 1 depicts a chart 10 of the specific energy and energy density for a number of different battery chemistries. As evident from chart 10, batteries with a form of lithium metal incorporated into the negative electrode afford exceptionally high specific energy (in Wh/kg) and energy density (in Wh/L) compared to batteries with conventional carbonaceous negative electrodes. The high specific energy results from the low atomic weight of lithium (6.94).

In addition to high specific energy and energy density, Li-ion batteries charge faster than other battery types. Consequently, Li-ion based technologies are successfully replacing the well-established Nickel-Cadmium (Ni—Cd) and Nickel Metal Hydride (NiMH) technologies.

Figure 2:
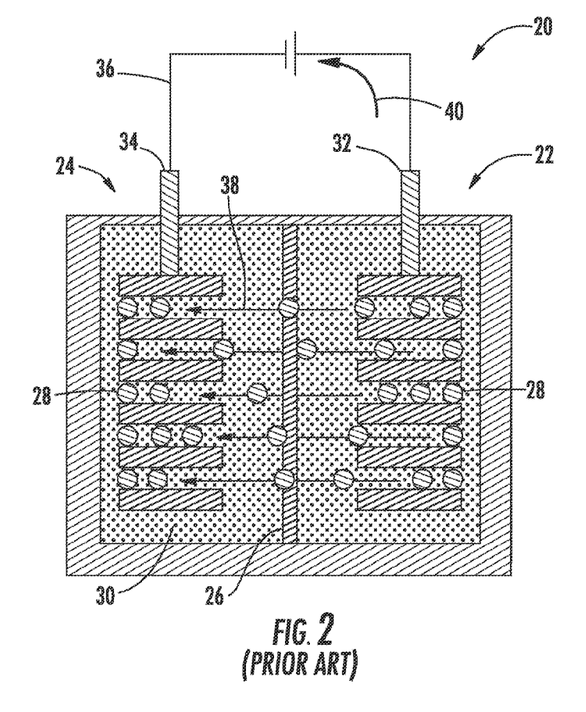
FIG. 2 depicts a schematic view of a prior art lithium ion intercalation battery connected to an external charging circuit.

A typical prior art Li-ion cell 20 is depicted in FIG. 2. The cell 20 includes a cathode 22, an anode 24, and, in non-solid constructions, a separator 26. The cathode 22 is usually a lithium metal oxide like $LiCoO_2$ wherein Li atoms 28 chemically form a complex compound. The anode 24 is usually graphite or some other material wherein lithium atoms 28 are physically accommodated within the vacancies in the anode material (intercalate) but do not chemically bond. The separator 26 is provided to prevent physical contact between the cathode 22 and the anode 24 while allowing for lithium ion transport. In the cell 20, lithium transport is effected by an electrolyte 30 within the cathode 22, the anode 24, and the separator 26. A typical electrolyte is $LiFePO_4$. Thus, while FIG. 2 depicts the lithium atoms 28 within the electrolyte 30, the lithium atoms 28 in the electrolyte 30 are in the form of a lithium ion.

The cell 20 further includes a metal current collector 32 for the cathode 22 and a metal current collector 34 for the anode 24. The metal current collector 32 and the metal current collector 34 are used to connect the cell 20 to an external circuit 36 which in FIG. 2 is a charging circuit.

During charging of the cell 20 the positive potential of the charging circuit 36 connected to the cathode 22 forces the Li-ions from the $LiCoO_2$ complex to migrate via the electrolyte 30 in the direction of the arrows 38 and intercalate (insert into interstitial or other vacancies) in the material used to form the anode 24. This ionic movement from the cathode 22 to the anode 24 via the electrolyte 30 is balanced by an electronic movement from the cathode 22 to the anode 24 via the external circuit 36 as indicated by the arrow 40.

Figure 3:
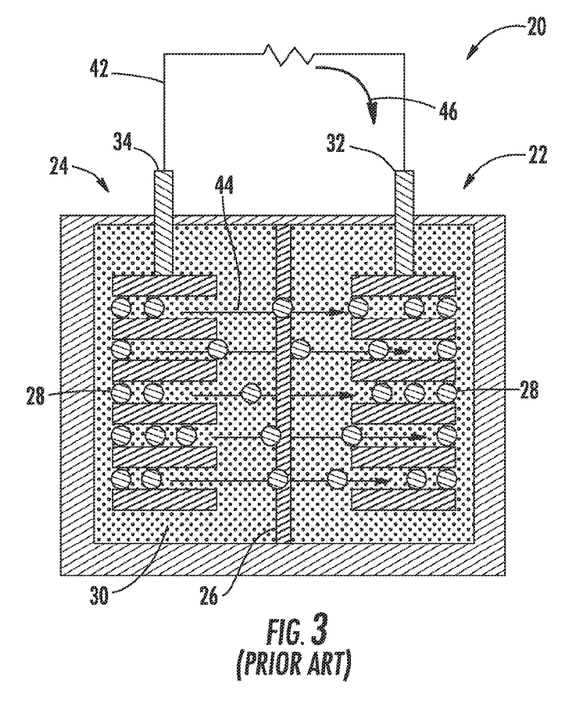
FIG. 3 depicts the prior art lithium ion intercalation battery of FIG. 2 connected to an external load.

Upon connection of an external circuit 42 in the form of an electrical load as depicted in FIG. 3, the above described process reverses. Accordingly, the lithium atoms 28 diffuse back from the anode 24 to the cathode 22 in ionic form via the electrolyte 30 in the direction of the arrows 44. The ionic flow of lithium 28 is balanced by an electronic flow through the external circuit 42 from anode 24 to the cathode 22 as indicated by the arrow 46.

As noted above, the lithium atoms 28 intercalate into the anode material. The physical insertion of the lithium atoms 28 into vacancies within the material results in a volume expansion of the anode material. Consequently, in addition to the anode material being selected based upon being electrochemically stable as a part of an electrochemical reaction, the anode material should also be physically stable and tolerant to the resulting volume expansion from intercalation of the lithium atoms. A poorly selected anode material will exhibit fracture resulting in premature failure of the battery or cell.

One material which is generally considered to be acceptable as an anode material is graphite. Graphite is structurally made of several parallel sheets of graphene held together loosely by weak Van der Waals force. Li atoms easily intercalate between these layers of graphene, resulting in only 10% volumetric expansion with no "deconstruction" or failure of the original Graphite material.

Another consideration in selection of an anode material is the formation of a solid electrolyte interphase (SEI) on the anode material. Since most electrolyte materials (like $LiFePO_4$) are unstable in the presence of the chemical potential at the anode, the electrolyte materials decompose at the anode surface into lithium containing organic and inorganic compounds. This layer has been observed even on graphite anode materials.

The SEI is typically fully formed after one or two cycles of lithiation from the electrolyte onto the anode. The SEI is electrically insulating in nature while it maintains a good ionic conductivity. Formation of the SEI also prevents further decomposition of the electrolyte at the anode. If the SEI layer did not form, the electrolyte would totally decompose resulting in failure of the battery. Thus, the formation of the SEI is crucial for the feasibility of Li-ion batteries. Consequently, the proper chemistry and anode materials are necessary to generate an SEI which is not overly thick, resulting in increased resistance.

Figure 4:
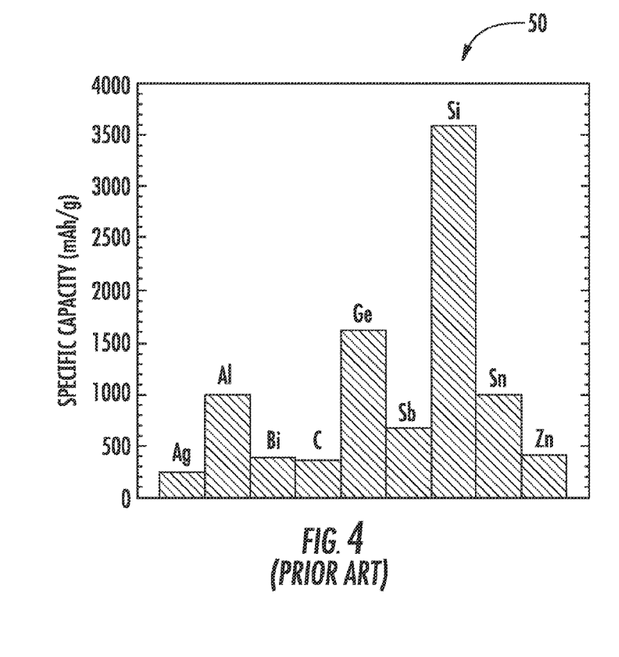
FIG. 4 depicts the specific capacity of various known anode materials.
Figure 5:
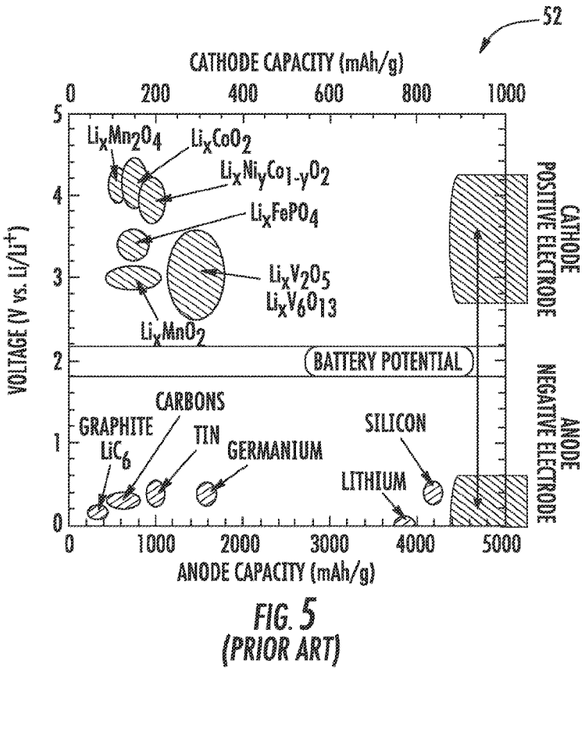
FIG. 5 depicts the specific capacity of various known anode and cathode materials.

Silicon is another material which has been analyzed for use in a lithium intercalation battery. Silicon has the largest specific capacity known of any anode material as exhibited by the chart 50 of FIG. 4 and the chart 52 of FIG. 5. Silicon accommodates a massive amount of Li via intercalation phases (several phases exist like $Li_{12}Si_7$, $Li_7Si_3$, $Li_{15}Si_4$ etc.). Thus it is possible to store an enormous charge density of about 3272 mAh/g.

Silicon also has a very high gravimetric energy density, theoretically able to intercalate about 4.4 Li atoms for every Si atom. (Compared to 1 Li atom for every 6 carbon atoms in graphite). The high gravimetric energy density comes as a cost, however, as silicon exhibits a 280% volume expansion. The extreme volume expansion leads to sudden material fracture and battery failure even after a mere 50 cycles of charging and discharging.

The extreme volume expansion of silicon also results in destruction of the SEI which cracks as the base silicon material expands. Subsequently, a new SEI layer is formed on the freshly exposed silicon, and then destroyed during the next lithiation cycle. Consequently, the electrolyte is constantly being depleted.

One attempt to mitigate the effects of the extreme expansion of silicon has been reported by Szczech et al., "Nanostructured Silicon for High Capacity Lithium Battery Anodes," *The Royal Society of Chemistry*, Vol. 4, pp. 56-72, 2011 and by Takur et al., "Inexpensive Method for Producing Macroporous Silicon Particulates with Pyrolyzed Polyacrylonitrile For Lithium Ion Batteries," *Nature—Scientific Reports*, Vol. 2, No. 795. pp. 1-7, 2012. In these investigations, the silicon surface was nanostructured to convert the silicon surface into a sponge-like material that could absorb more Li ions and be able to relax the strain resulting from the volume expansion. Other nano-structuring includes porosification of silicon (nanoporous, mesoporous, macroporous silicon), silicon nanowires, silicon nanoparticles etc. While nano-structuring addresses the issue of expansion, it does not address the issue of SEI destruction.

Other investigations have been made into providing an artificial SEI which is less susceptible to fracturing. For example, Nguyen et al., "Alumina-coated Silicon-based Nanowire Arrays for High Quality Li-Ion Battery Anodes," *Journal of Material Chemistry*, Vol. 22, pp. 24618-24626, 2012 report upon the use of an ultra-thin layer of atomic layer deposited (ALD) alumina ($Al_2O_3$) coated onto a silicon nanowire to act as an "artificially introduced" thin insulating SEI layer. While the ALD alumina layer improved performance of the silicon nanowire, the ALD alumina layer on the nanowires as reported by Nguyen et al. still exhibited cracking.

While there are significant challenges in using silicon as an anode material, the potential of incorporating silicon makes further research appealing. The capacity and size of a battery incorporating silicon would enable chip-scale micro-batteries (like integrated circuits, MEMS devices etc.,) that could power devices like MEMS sensors, CMOS memories, Smart Cards, Smart Dust, Drug Delivery Systems, Medical Implantable Devices etc.

What is needed therefore is a lithium intercalation type battery which incorporates silicon as an anode material. A lithium intercalation type battery with silicon as an anode material which exhibits a stable SEI is also desired.

SUMMARY

In accordance with one embodiment, a Li-ion battery includes a lithium based compound in a cathode, a first porous silicon portion in an anode, and a layer of atomic layer deposited (ALD) alumina coating the first porous silicon portion and contacting the cathode.

In some embodiments, a Li-ion battery includes a second porous silicon portion in the anode, wherein the first porous portion and the second porous portion are parts of a single porous silicon slab.

In one or more of the above embodiments, the battery includes a third porous silicon portion in the anode, the third porous silicon portion comprising bulk silicon, wherein the second porous silicon portion is located between the first porous silicon portion an the third porous silicon portion.

In one or more of the above embodiments, the battery includes a current collector in the anode, the current collector in direct contact with the third porous silicon portion.

In some embodiments, a second porous silicon portion has a nominal pore diameter of about 2 to 5 nanometers;

In one or more of the above embodiments, the battery includes a solid electrolyte material within the pores of the first porous silicon portion.

In some embodiments, the solid electrolyte material includes Beta-Alumina-Solid-Electrolyte (BASE).

In some embodiments, the solid electrolyte material includes a poly-crystalline film of alumina.

In one embodiment, a method of forming a Li-ion battery includes determining a desired pore size for a first portion of a porous silicon anode, determining a Knudsen Diffusion coefficient for the determined pore size, determining a desired coating extent of the first portion of porous silicon, determining a soak time for the first portion of porous silicon, generating an atomic layer deposited (ALD) alumina coating in the first portion of porous silicon using the determined soak time, and positioning a coated portion of the first portion of porous silicon adjacent to a cathode including a lithium based compound.

In one or more of the above embodiments, determining the desired coating extent includes determining a desired coating extent of less than 100% of the first portion of the porous silicon anode.

In one or more of the above embodiments, generating the ALD alumina coating includes generating the ALD alumina coating in a porous silicon slab.

Some of the above methods include positioning a second porous silicon portion in the anode adjacent to the first portion of the porous silicon anode, the second porous silicon portion comprising bulk silicon.

In some of the above methods, positioning the second porous silicon portion in the anode includes positioning the second porous silicon portion in direct contact with an uncoated portion of the first porous silicon portion.

Some of the above methods include positioning a current collector in direct contact with the second porous silicon portion.

In some of the above methods, determining the desired pore size includes determining a nominal pore diameter of about 2 to 5 nanometers.

Some of the above methods include forming a solid electrolyte material within the pores of the first portion of the porous silicon anode.

In some of the above methods, forming the solid electrolyte material includes forming Beta-Alumina-Solid-Electrolyte (BASE) within the pores of the first portion of the porous silicon anode.

In some of the above methods, forming the solid electrolyte material includes forming a poly-crystalline film of alumina within the pores of the first portion of the porous silicon anode.

DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

Figure 6:
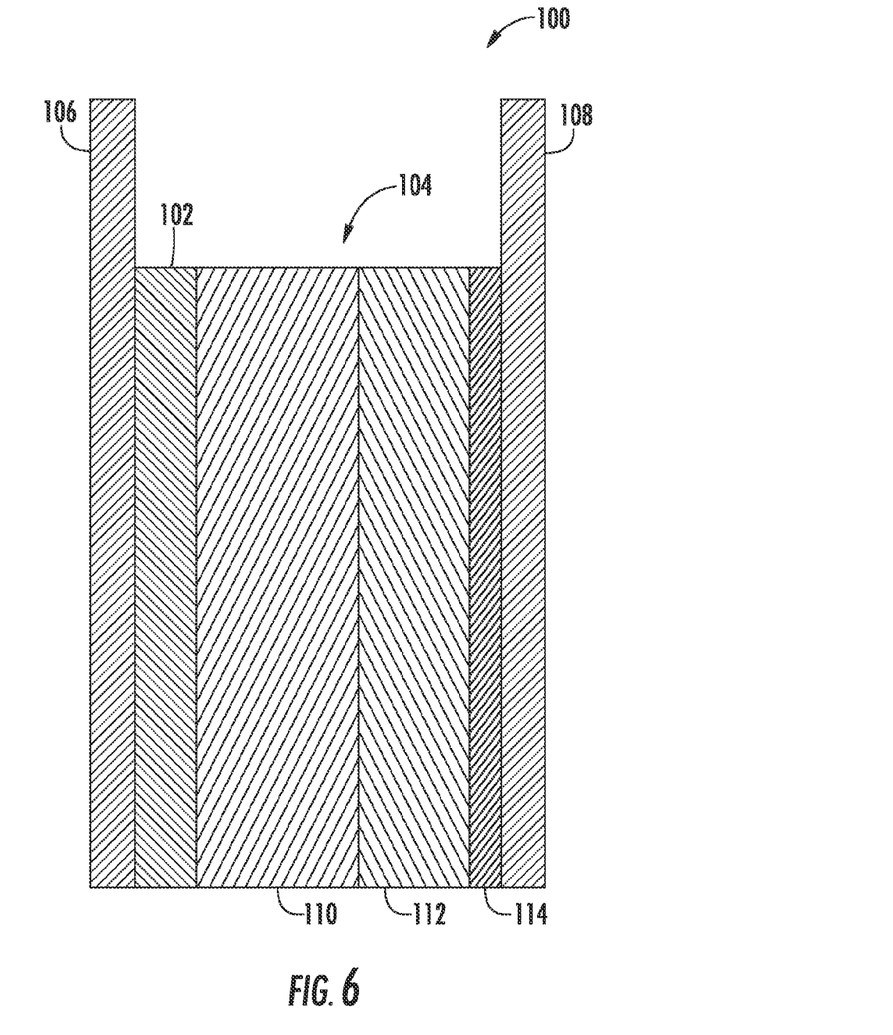
FIG. 6 depicts a schematic view of a lithium ion intercalation battery including a porous silicon anode material partially coated with ALD alumina.

FIG. 6 depicts a solid-state Li-ion battery cell 100. The cell 100 includes a cathode 102 and an anode 104. A current collector 106 is in electrical communication with the cathode 102 while a current collector 108 is in electrical communication with the anode 104. The current collectors 106 and 108 are a current carrying material such as aluminum, platinum, etc. The cathode 102 is formed with a lithium based compound such as $LiCoO_2$, $LiNbO_3$, and $Li_2CO_3$. The cathode 102 and the current collectors 106 and 108 function in substantially the same manner as the corresponding components in the cell 20. The cell 100, however, functions differently because the cell 100 is structured differently as further discussed below.

Specifically, the anode 104 is made from porous silicon. A coated portion 110 of the porous silicon is coated with ALD alumina and positioned in contact with the cathode 102. The ALD alumina is an SEI. An uncoated portion 112 of the porous silicon is not coated with the ALD alumina. The uncoated portion 112 provides additional space for expansion of the silicon upon lithium intercalation. Finally, a bulk silicon portion 114 is provided to collect electron current from the current collector 108.

ALD of alumina (both thermal and plasma-enhanced) is a mature and well-characterized process. Optimal use of the Knudsen Diffusion Regime is achieved by diffusion of the alumina precursor (tetra-methyl-aluminum (TMA), having a molecular weight of 144.18 g/mole) through 2-50 nm pores. In this approach, the pore diameter is smaller than the mean-free path, and molecules thus collide with pore walls more frequently than with each other.

Using a pore size diameter of 10 nm and a process temperature of 250° C. (523 K), a relatively high Knudsen Diffusion coefficient (D) is calculated in accordance with the following equation:

$$D_{KA} = \frac{10 \times 10^{-7} \text{ cm}}{3} \sqrt{\frac{8\left(1.38 \times 10^{-16} \frac{\text{g} \cdot \text{cm}^2}{\text{s}^2 \cdot \text{K}}\right)\left(6.023 \times 10^{23} \frac{\text{molecules}}{\text{mole}}\right)}{\pi}} \sqrt{\frac{523 \text{ K}}{144.18 \text{ g/mol}}}$$

$$= 92.361 \times 10^{-3} \text{ cm}^2/\text{sec}$$

Knowing the Knudsen Diffusion coefficient for a particular porosity, the extent of ALD coating in a porous silicon anode material can be controlled by the TMA soak time. As the soak times for the TMA molecules increases, increased diffusion of the TMA through the porous silicon will be realized. A rough estimate of the soak time for a desired diffusion depth can be approximated using a one dimensional Fick's Diffusion equation with time (t) in one dimension (taken as the x-axis) from a boundary located at position x=0, where the concentration is maintained at a value n(0) is:

$$n(x, t) = n(0)\text{erfc}\left(\frac{x}{2\sqrt{Dt}}\right)$$

where "erfc" is the complementary error function, and the length $2\sqrt{Dt}$ is called the diffusion length and provides a measure of how far the concentration has propagated in the x-direction by diffusion in time (t).

For 99% diffusion, the erfc plot shows:

$$\frac{x}{2\sqrt{Dt}} = 2 \to t = \frac{x^2}{16D}$$

Figure 7:
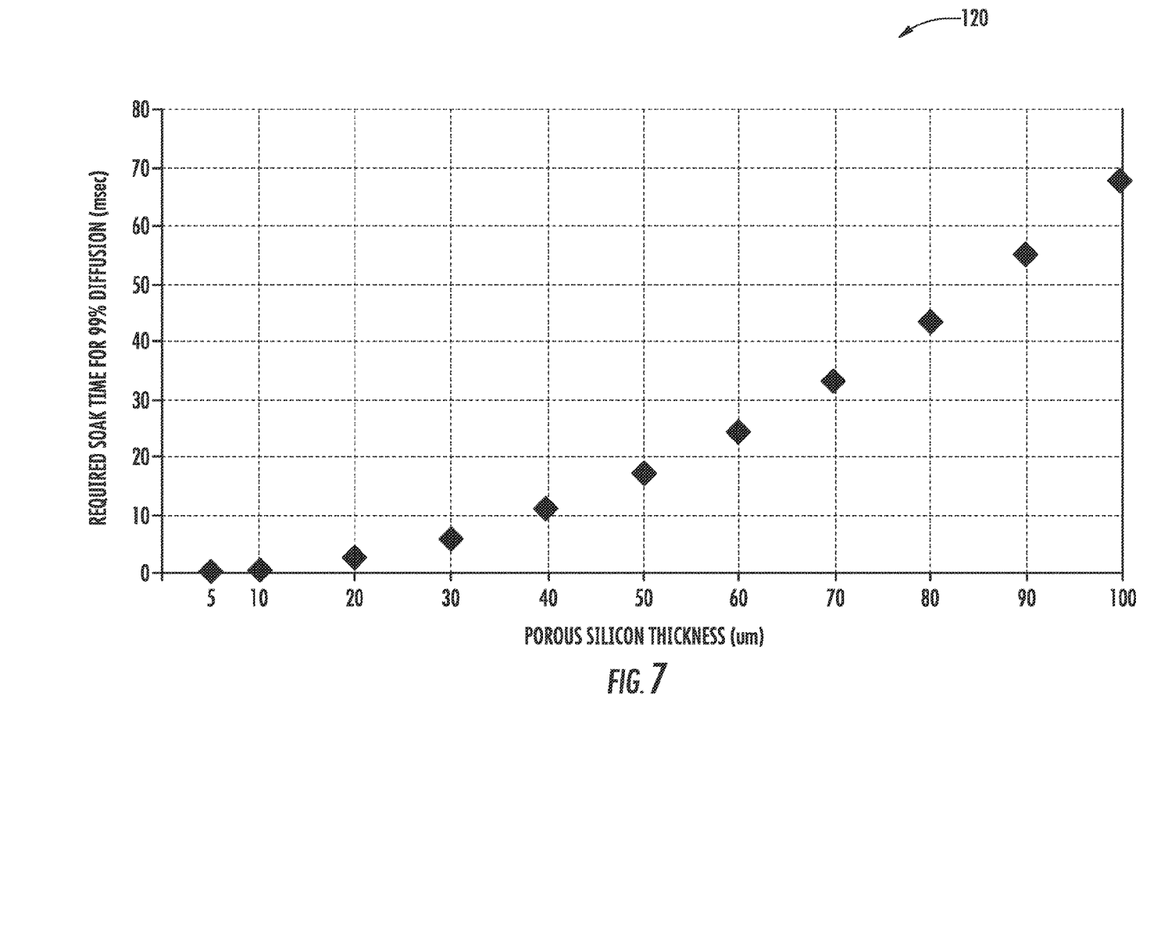
FIG. 7 depicts a chart of the required TMA soak time for various thicknesses of a porous silicon anode material.

FIG. 7 shows a chart 120 of the required soak time of TMA for a given porous silicon thickness of "x" using the calculated diffusion coefficient (D) of $92.361 \times 10^{-3}$ cm²/sec. As evident from chart 120, even for a 99% diffusion into 100 μm porous silicon, a TMA soak time of approximately 70 msec is required. If desired, additional soak time may be used. In some embodiments, soak times of from 6 seconds to 3 minutes are used.

Figure 8:
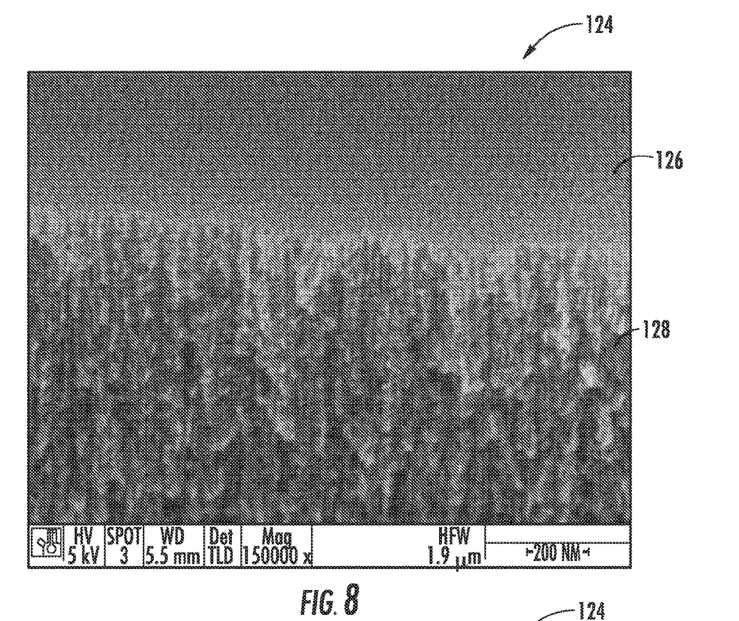
FIG. 8 depicts a microphotograph of a porous silicon anode material.
Figure 9:
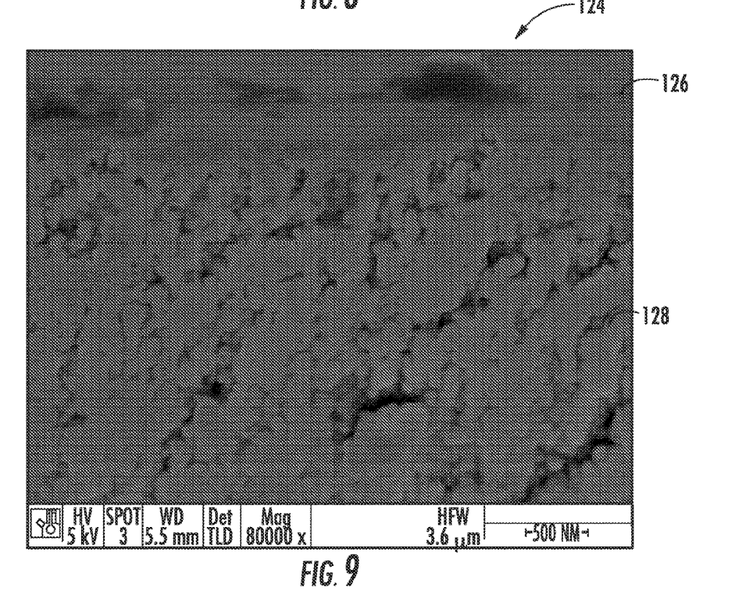
FIG. 9 depicts a microphotograph of the porous silicon anode material with ALD alumina.

FIG. 8 shows a photomicrograph of a portion of a porous silicon slab anode material 124 prior to ALD of alumina. The porous silicon slab anode material 124 has a nominal pore diameter of 2 to 5 nm. In FIG. 8, an upper surface 126 and a cross section 128 of the porous silicon slab anode material 124 is shown. FIG. 9 shows a microphotograph of the same porous silicon slab anode material 124 after ALD of alumina. As is evident from FIG. 9, nearly 100% filling of the ALD alumina into the nano-pores of the porous silicon anode material 124 was accomplished. The use of ALD in depositing alumina in a porous silicon anode material 124 is thus demonstrated. Moreover, the manner in which initial porosity of the porous silicon anode material 124 is established does not limit the ALD. Porosification can be accomplished on a plain surface of a silicon slab, but could also be done obtained using dry or wet etching techniques.

Figure 10:
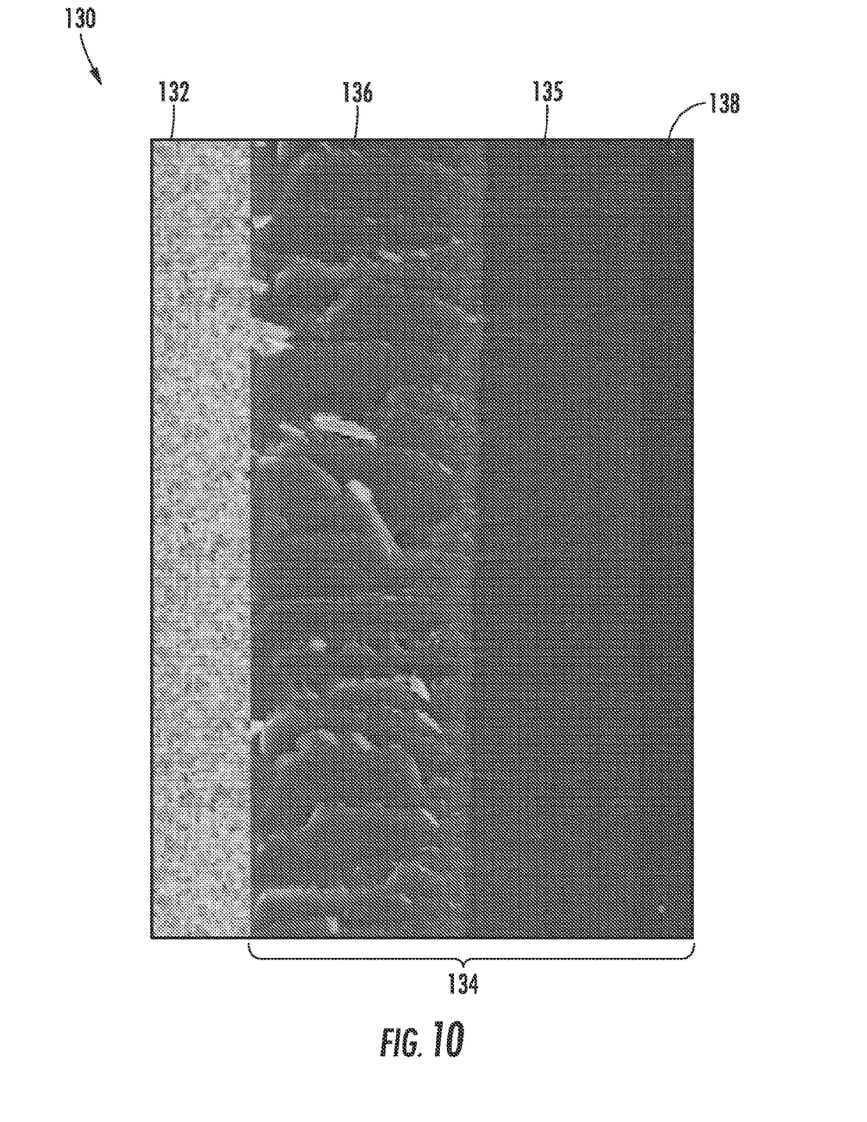
FIG. 10 depicts a microphotograph of a cell including a porous silicon anode material with ALD alumina partially coating the porous silicon anode material along with a portion of uncoated porous silicon anode material and bulk silicon.

While the porous silicon anode material 124 of FIG. 9 validates the ability to control the TMA soak time to effect substantially complete ALD coating of the porous silicon substrate, the embodiment of FIG. 6 includes an uncoated portion 112. FIG. 10 is a microphotograph of a portion of a cell 130 wherein soak time has been controlled to obtain only partial ALD covering of a porous silicon anode material. In FIG. 10, the cell 130 includes a cathode 132 and an anode 134. Visible within the anode 134 is a coated portion 136, and uncoated portion 135, and a bulk silicon portion 138. Accordingly, TMA soak time can be controlled to provide a desired amount of diffusion into a porous silicon anode material.

Moreover, alumina is known to be an excellent seed-layer for most other materials that could be deposited via ALD on porous silicon. These other materials in some embodiments include the electrolyte material and/or the cathode material. For example, an isomorphic form of alumina, called Beta-Alumina-Solid-Electrolyte or "BASE", is a well-known solid electrolyte material typically considered for use as an electrolyte in sodium-sulfur battery cells. BASE, in addition to conducting sodium ions, is also an excellent conductor of lithium, potassium, silver, lead, strontium, barium ions etc.

BASE is poly-crystalline (a ceramic) while ALD alumina is typically amorphous in nature. Consequently, the ionic conductivity of ALD alumina may be slightly lower than BASE but is still sufficient for integration into Li-ion battery cells. ALD alumina can also be converted into poly-crystalline form by a hydrogen/nitrode/forming gas annealing at about 1100° C. allowing the aluminum and oxygen in alumina to re-arrange thereby forming poly-crystalline structures. Alternatively, ALD alumina can also be converted into poly-crystalline form by depositing alumina using a very slow ALD process with extended soak times for the precursors so that sufficient time is given to redistribute uniformly on the substrate and form poly-crystalline films of alumina. Thus, ALD alumina, in addition to being utilized as an SEI layer, is further used in some embodiments as a solid electrolyte, thereby considerably simplifying the construction of an all-solid-state Li-ion battery.

Figure 11:
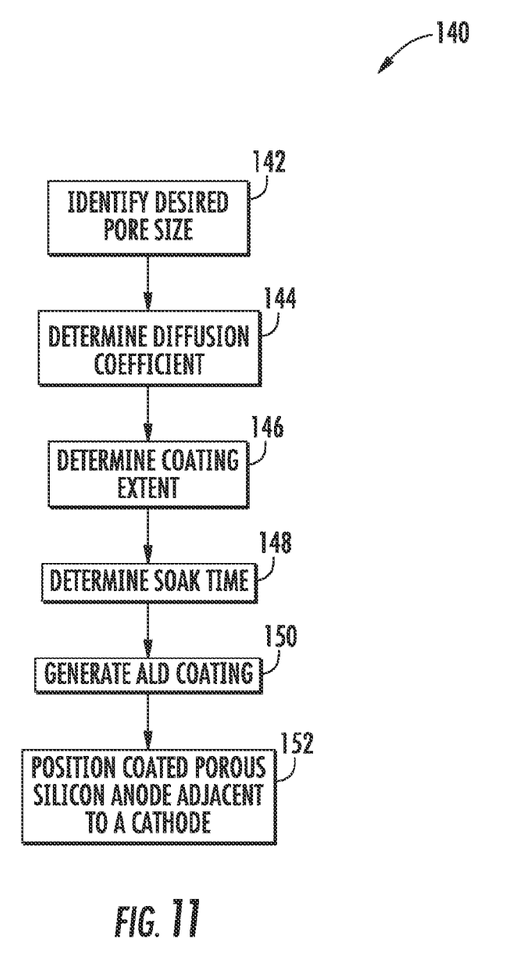
FIG. 11 depicts a process for forming a cell with a porous silicon anode material with ALD alumina.

FIG. 11 depicts a process 140 which can be used to form a cell with a porous silicon anode material with ALD alumina. At block 142, a desired pore size for a porous silicon anode material is identified. Identification of a desired pore size in some embodiments is effected by identifying a commercially available porous silicon material. Once the pore size is known, the Knudsen Diffusion coefficient for the identified porosity is determined (block 144). The desired extent of coating within the porous silicon anode material is then determined (block 146) and the necessary TMA soak time to obtain the determined extent of coating is determined (block 148). In embodiments wherein substantially complete coating is desired, blocks 144, 146 and 148 are effectively performed by selecting a soak time in excess of the soak time expected to provide 100% coverage such as by selecting a 3 minute soak time for a 100 μm thick porous silicon anode material.

Once a TMA soak time is determined (block 148), an ALD alumina coating is generated on a selected porous silicon anode material using the determined TMA soak time (block 150). The porous silicon anode material with a full or partial ALD alumina coating is then positioned adjacent a selected cathode material.

Additional processing steps may be performed to provide a desired cell configuration. Such process steps include, in different embodiments, providing one or more current collectors, encasing the anode and cathode material, providing bulk silicon adjacent to the porous silicon anode material, and generating a poly-crystalline alumina film as an electrolyte.

The above described embodiments can be realized on a silicon substrate thus enabling fabrication of batteries on-chip. Advantageously, the disclosed cells can be fabricated alongside of other components on a chip using silicon microelectronics technology and MEMS technology.

On-Chip Li-ion micro-batteries in accordance with the disclosure can be used to power the nodes in a sensor network or to power implanted medical devices. The disclosed embodiments can be coupled with energy harvesting (harvesting wasted energy like vibration, electromagnetic radiation, solar radiation, etc., into electrical energy) to provide synergistic on-chip micro-batteries for storing the harvested energy in stand-alone microsystems (micro-robots, etc.).

The extremely high density pores in the disclosed cells including porous silicon anode material with ALD alumina provide a substantial improvement in the ability to repeatedly utilize the intercalation capacity of silicon. Consequently, very high-energy-density batteries can be realized in a minimum footprint. It is also possible to micro fabricate arrays of micro-batteries as a replacement for a single large macro-battery. Arrays of micro-batteries are particularly attractive for applications such as smart phones and tablets.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A method of forming a Li-ion battery comprising:
   determining a desired pore size for a first portion of a porous silicon anode;
   determining a Knudsen Diffusion coefficient for the determined pore size;
   determining a desired coating extent of less than 100% of the first portion of the porous silicon anode;
   determining a soak time for the first portion of porous silicon;
   generating an atomic layer deposited (ALD) alumina coating in the first portion of porous silicon using the determined soak time; and
   positioning a coated portion of the first portion of porous silicon adjacent to a cathode including a lithium based compound.

2. The method of claim 1, wherein generating the ALD alumina coating comprises:
   generating the ALD alumina coating in a porous silicon slab.

3. The method of claim 1, further comprising:
   positioning a second porous silicon portion in the anode adjacent to the first portion of the porous silicon anode, the second porous silicon portion comprising bulk silicon.

4. The method of claim 3, wherein positioning the second porous silicon portion in the anode comprises:
   positioning the second porous silicon portion in direct contact with an uncoated portion of the first porous silicon portion.

5. The method of claim 3, further comprising:
   positioning a current collector in direct contact with the second porous silicon portion.

6. The method of claim 1, wherein determining the desired pore size comprises:
   determining a nominal pore diameter of about 2 to 5 nanometers.

7. The method of claim 1, further comprising:
   forming a solid electrolyte material within the pores of the first portion of the porous silicon anode.

8. The method of claim 7, wherein forming the solid electrolyte material comprises:
   forming Beta-Alumina-Solid-Electrolyte (BASE) within the pores of the first portion of the porous silicon anode.

9. The method of claim 7, wherein forming the solid electrolyte material comprises:

forming a poly-crystalline film of alumina within the pores of the first portion of the porous silicon anode.

* * * * *